United States Patent [19]
Greutman
[11] 3,832,645
[45] Aug. 27, 1974

[54] WIDE BAND GAIN CONTROL CIRCUIT

[75] Inventor: Weldon W. Greutman, Hicksville, Ohio

[73] Assignee: International Telephone and Telegraph Corporation, Nutley, N.J.

[22] Filed: May 11, 1973

[21] Appl. No.: 359,386

[52] U.S. Cl. .......... 330/29, 330/28, 330/32
[51] Int. Cl. .......... H03g 3/30
[58] Field of Search .......... 330/28, 29, 35, 32, 17

[56] References Cited

FOREIGN PATENTS OR APPLICATIONS 873,564 7/1961 Great Britain .......... 330/29

OTHER PUBLICATIONS

Pargee, "Complementary Darlington: A Leading Omitter-Follower," Electronic Design, Vol. 14, No. 24, Oct. 25, 1966, pp. 102, 104.
Todd, "FETS As Voltage-Variable Resistors," Electronic Design, Vol. 13, No. 19, Sept. 13, 1965, pp. 66–68.
McIntosh, "Variable Resistance FET Gives 75-db Gain Control," Electronic Design Vol. 11, No. 18, Aug. 30, 1963.

*Primary Examiner*—Herman Karl Saalbach
*Assistant Examiner*—James B. Mullins
*Attorney, Agent, or Firm*—John T. O'Halloran; Menotti J. Lombardi, Jr.; Edward Goldberg

[57] ABSTRACT

The gain of a complementary Darlington circuit is controlled by a symmetrical field effect transistor to provide a wide band amplifier having a constant direct current reference voltage for output signal at various levels of gain. A pair of PNP-NPN Darlington stages are connected to eliminate the normal emitter-base junction offset voltages. The FET is connected to the emitter circuit of the output stage with feedback between the drain and gate electrodes to provide a constant linearized emitter resistance at each gain control setting.

3 Claims, 1 Drawing Figure

PATENTED AUG 27 1974
3,832,645
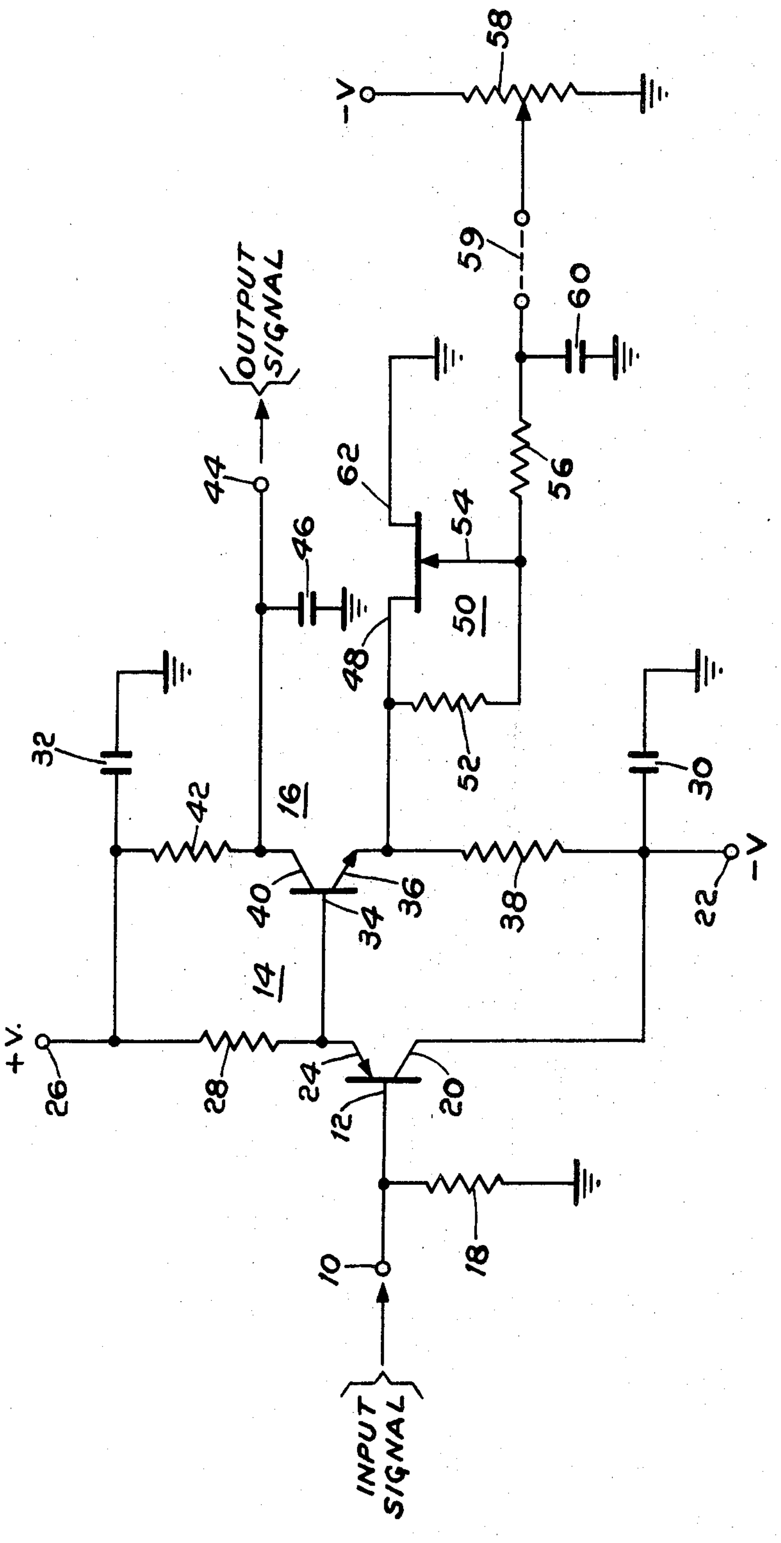

WIDE BAND GAIN CONTROL CIRCUIT

BACKGROUND OF THE INVENTION

1. Field of the Invention

The present invention is directed to a novel gain control circuit and particularly to a wide band amplifier having a constant direct current reference voltage for output signal at various gain settings.

2. Description of the Prior Art

In the past, in order to achieve very wide bandpass operation for solid state or transistor amplifiers, such as utilized in video amplifiers having a frequency range of from zero or d.c. up to over 50 MHz, it has generally been necessary to utilize highly complex sophisticated circuitry. A major difficulty of these circuits has been the shift or change in d.c. reference voltage for output signal at different gain control settings. This causes undesired effects in associated circuits and systems, such as shifting the reference level of a clipping circuit in a video display system to cause background brightness variations when adjusting the contrast control. Another problem in many circuits requiring operation over wide ranges is the inherent transistor emitter-base junction voltage offset which may be in the order of a few tenths of a volt. Due to this small voltage, the response characteristic of the amplifier is non-linear at small signals, where a small signal input will not be amplified until it exceeds this fixed bias. This has been overcome in some applications by employing a pair of differential amplifiers having a common emitter resistor to balance out the voltage drops. Such a circuit however continues to have the variation in the direct current reference voltage at different gain control levels. An example of a prior art circuit using differential amplifiers to eliminate the effect of changes in the gain control voltage on output signal is shown in U.S. Pat. No. 3,141,137, issued July 14, 1964 and assigned to the same assignee as the instant application. The general use of field effect transistors for isolation purposes is also known, as described in U.S. Pat. No. 3,229,218 issued Jan. 11, 1966. It has also been known to use Darlington connected amplifier circuits to provide linear automatic gain control amplifiers, such as indicated in U.S. Pat. No. 3,292,096, issued Dec. 13, 1966. The normal Darlington connection of like transistors, however, adds the two emitter-base offset voltages which then requires further compensation. Such circuits thus have generally been quite complex and did not achieve the extremely broad band linearity desired in many applications.

SUMMARY OF THE INVENTION

It is therefore the primary object of the present invention to provide a simplified linearized gain control stage which eliminates the effect of gain control voltage changes on output signal over an extremely wide bandpass range.

This is achieved by a novel combination of a Darlington amplifier pair of transistors having a complementary PNP-NPN connection and a symmetrical field effect transistor connected in the emitter circuit of the output stage. The particular Darlington connection balances out the base-emitter offset voltages, while the FET employs a feedback connection between drain and gate which provides a linearized emitter resistance to eliminate the effect of gain control voltage changes on the output signal over a wide range.

The details of the invention will be more fully understood from the following description in conjunction with the accompanying drawing.

BRIEF DESCRIPTION OF THE DRAWING

The single FIGURE shows a schematic drawing of the novel gain control circuit.

DESCRIPTION OF THE PREFERRED EMBODIMENT

As shown in the FIGURE, a gain control circuit includes a signal input terminal 10 connected to the base input electrode 12 of a first PNP type common collector transistor amplifier input stage 14 of a pair of complementary connected Darlington transistor amplifiers 14, 16. The base electrode is connected to a ground reference point by a suitable resistor 18. The collector electrode 20 is connected to the negative potential terminal 22 of a direct current source and the emitter electrode 24 is connected to the positive terminal of the d.c. source through a suitable resistor 28. Bypass capacitors 30, 32 are connected to power supply terminals 22, 26 to filter out undesirable signal frequencies.

The emitter output electrode 24 is directly coupled to the base input electrode 34 of the following complementary NPN type common emitter transistor amplifier output stage 16 of the Darlington connected pair. Emitter electrode 36 of the second transistor is connected to the negative d.c. potential terminal through series emitter resistor 38 which determines the maximum degeneration of the stage. The output collector 40 is connected to the positive potential terminal through resistor 42. The collector 40 is also connected to supply amplified output signal at terminal 44 to a following stage such as a clipping circuit of a video display system. A capacitor 46 connected to ground at the output terminal simulates capacitance of an oscilloscope probe which may be connected at this point. The particular complementary PNP-NPN type Darlington connection of the pair of transistors 14, 16 balances out and eliminates the usual base-emitter junction offset voltages of each stage. This permits a linear response characteristic to be obtained at low signals so that a zero volt input signal at base 12 of transistor 14 will produce a constant reference voltage output signal at the collector 40 of transistor amplifier 16.

The emitter electrode 36 of transistor 16 is also connected to the drain electrode 48 of a symmetrical bipolar NPN type field effect transistor 50. The FET should be of a type wherein the source and drain electrodes are interchangeable. A feedback resistor 52 is connected between the drain 48 and gate electrode 54. The gate electrode is also connected through a resistor 56 to an adjustable arm of a remotely positioned gain control potentiometer 58 which is connected between the negative supply terminal and ground. The dashed line 59 schematically indicates the remote location of the gain control 58. Resistor 56 is also connected to ground through a filter capacitor 60. The source electrode 62 of the FET is likewise connected to ground. Resistors 52, 56 are preferably of equal value, such as 10,000 ohms, to provide a voltage divider feedback network so that one-half of the emitter signal coupled to the drain electrode 48 is applied at gate electrode 54.

With this signal relationship between drain and gate electrodes and the symmetrical FET characteristics, the resistance of the FET is linearized so that it remains constant at different signal levels for a given average bias setting on the gate. Whereas a normal FET would change resistance with different signals applied, in this case the resistance remains constant regardless of the input signal amplitude. The FET thus parallels emitter resistor 38 between emitter 36 and ground so that the ON or conduction resistance of the FET primarily determines the minimum emitter degeneration. The resistance of the FET varies from approximately 30 ohms at zero volts bias to very high values at pinch-off in the non-conduction state. The variation of gain control potentiometer 58 thus changes the direct current potential at gate 54 and current conduction through the FET to ground which determines the gain of transistor 16. A low bias increases the gain of the transistor, while a high bias decreases the gain.

Since the gate electrode does not conduct, there is no quiescent current through the FET. Conduction occurs only upon application of a signal voltage, with the gain or signal amplification at the output collector controlled by the bias on the gate. This characteristic isolates any input component due to a change in the gain control from appearing at the output. The gain can thus be varied without changing the output signal d.c. reference. A zero reference signal input can therefore be remotely controlled in amplitude without changing the output signal reference. This permits positioning of the d.c. gain control at a remote location. Gain variations of from about 0.3 to 10 with peak to peak output voltages from 3 to 10 volts are available with this circuit which has a linear response over a range of from d.c. to more than 50 MHz. The gain may also be reduced to a lower value by replacing emitter resistor 38 with a constant current device. The particular values of the various circuit elements are not critical. One embodiment of the circuit includes the following components:

| | |
|---|---|
| Transistor 14 | 2N2907A |
| Base input resistor 18 | 51 ohms |
| Emitter resistors 28, 38 | 1.2K ohms each |
| Direct voltage source at terminals 22, 26 | −12V, +12V |
| Transistor 16 | 2N2222A |
| Collector resistor 42 | 390 ohms |
| Capacitors 30, 32, 60 | 0.1 mfd. each |
| Capacitor 46 | 11.5 pf. |
| Field Effect Transistor | 2N4857 |
| Resistors 52, 56 | 10K ohms each |
| Potentiometer 58 | 1K ohms |

The present invention thus provides a simplified wide band linearized gain control circuit which substantially eliminates the effect of gain control changes on the output signal. While only a single embodiment has been illustrated and described, it is to be understood that many variations may be made in the design and configuration without departing from the scope of the invention as set forth in the appended claims.

What is claimed is:

1. A gain control device comprising:

a pair of complementary direct coupled transistor stages including a first common collector connected transistor and a second common emitter connected transistor, the emitter of said first transistor being directly coupled to the base of said second transistor;

means applying an input signal to the base electrode of said first transistor;

output signal means connected to the collector of said second transistor;

a source of direct current potential having negative and positive terminals, the collectors and emitters of respective first and second transistors being connected between opposite negative and positive terminals, an emitter resistor connected between said second emitter and one of said terminals;

a symmetrical bipolar type field effect transistor having drain and source electrodes connected between said second emitter and a common reference point, one of said electrodes being directly connected to said second emitter and said emitter resistor; and a gain control circuit directly connected to the gate electrode of said field effect transistor, said circuit including adjustable resistive means connected to said potential source, a voltage divider network connected between said second emitter and said adjustable resistive means and a connection from said network to said gate electrode, said voltage divider including a first resistor connected between said second emitter and said gate electrode and a second resistor of substantially equal value to said first resistor connected between said gate and said adjustable resistive means.

2. The device of claim 1, wherein said first transistor is of a PNP conductivity type and said second transistor is of a NPN conductivity type, said first collector being connected to said negative terminal, a third resistor connected between said first emitter and said positive terminal, said emitter resistor being connected between said second emitter and said negative terminal, and a further resistor connected between said second collector and said positive terminal.

3. The device of claim 2, wherein said adjustable resistive means includes a remotely positioned potentiometer connected between said negative terminal and said reference point and having an adjustable arm, said second resistor being connected between said gate and adjustable arm and including means remotely connecting said arm and second resistor.

* * * * *